(12) United States Patent
Okuno et al.

(10) Patent No.: US 6,579,748 B1
(45) Date of Patent: Jun. 17, 2003

(54) FABRICATION METHOD OF AN ELECTRONIC COMPONENT

(75) Inventors: Atsushi Okuno, Osaka (JP); Noriko Fujita, Osaka (JP); Yuki Ishikawa, Kyoto (JP); Noritaka Oyama, Osaka (JP)

(73) Assignee: Sanyu Rec Co., Ltd., Osaka (JP)

( * ) Notice: Subject to any disclaimer, the term of this patent is extended or adjusted under 35 U.S.C. 154(b) by 0 days.

(21) Appl. No.: 09/572,210

(22) Filed: May 17, 2000

(30) Foreign Application Priority Data

| May 18, 1999 | (JP) | 11-137857 |
| Jan. 19, 2000 | (JP) | 2000-010694 |
| Mar. 29, 2000 | (JP) | 2000-092316 |

(51) Int. Cl.[7] .......... H01L 21/44; H01L 21/48; H01L 21/46; H01L 21/301
(52) U.S. Cl. .......... 438/124; 438/112; 438/127; 438/459; 438/465
(58) Field of Search .......... 438/112, 114, 438/465, 113, 459, 959, 124, 126, 127

(56) References Cited

U.S. PATENT DOCUMENTS

| 5,580,466 A | * | 12/1996 | Tada et al. .......... 438/114 |
| 5,661,086 A | * | 8/1997 | Nakashima et al. .......... 257/668 |
| 5,759,269 A | * | 6/1998 | Cutting et al. .......... 118/213 |
| 5,786,634 A | * | 7/1998 | Nishikawa et al. .......... 257/717 |
| 5,920,769 A | * | 7/1999 | Ball et al. .......... 438/113 |
| 6,001,671 A | * | 12/1999 | Fjelstad .......... 438/112 |
| 6,008,070 A | * | 12/1999 | Farnworth .......... 216/3 |
| 6,096,574 A | * | 8/2000 | Smith .......... 438/106 |
| 6,107,164 A | * | 8/2000 | Ohuchi .......... 438/465 |
| 6,140,144 A | * | 10/2000 | Najafi et al. .......... 438/53 |
| 6,353,267 B1 | * | 3/2002 | Ohuchi et al. .......... 257/787 |
| 6,391,684 B2 | * | 5/2002 | Ohsawa .......... 438/111 |

* cited by examiner

Primary Examiner—Caridad Everhart
Assistant Examiner—Chuong Luu
(74) Attorney, Agent, or Firm—Pearne & Gordon LLP

(57) ABSTRACT

An object of the present invention is to present a fabrication method for electronic components that allows further reduction in the size of electronic components by making the semiconductor substrate thinner, and at the same time allows operation as an electronic circuit with no problems, and further, has a durability sufficient to endure even use in a mobile telephone. In order to attain this object, the present invention has a first application process (process S12) in which encapsulating resin is applied to the surface of the substrate on which the posts are formed, a back surface grinding process (process S18) in which the back surface of said substrate is ground, a second application process (process S20) in which an encapsulating resin is applied to the back surface of said substrate after being ground, and a separation process (process S26) in which said substrate is cut along with said encapsulating resin and at the same time individual electronic components are separated.

14 Claims, 14 Drawing Sheets

FABRICATION METHOD OF AN ELECTRONIC COMPONENT

BACKGROUND OF THE INVENTION

1. Field of the Invention

The present invention relates to a fabrication method for electronic components such as diodes, transistors, integrated circuits, large scale integration, and in particular to a fabrication method for electronic components used in applications that require reduction in weight and size, such as mobile telephones, personal computers, notebook computers, computer game devices, wrist watches, electronic music boxes, navigation systems, small sized televisions, and camera modules.

2. Background Art

Conventionally, general use electronic components for an IC, etc., are formed by mounting a semiconductor element in which electronic circuits are formed on a lead frame, connecting by a wire bonds, etc., the electrodes of these electronic circuits and the connection terminals for external connection, and then curing a fused, hardened epoxy resin encapsulating material in a metal mold.

Recently, the popularization of devices that must be small sized and lightweight, such as a mobile phone, is increasing. Generally, in this type of device, first, after the specifications such as the size, weight, and design of the body are decided, the electronic circuits, antenna, etc., that are included in the specification are designed. The external dimensions and weight of electronic components employed in devices having this type of use are extremely restricted.

Thus, along with the reduction in weight and size of electronic components, technology has been proposed in which, when carrying out the encapsulation of the electronic component, the semiconductor elements and films in which the electronic elements are formed are used as an interposer, and after the semiconductor element is mounted and connected by the wire bonds or bumps on this interposer, it is sealed in the above-mentioned metal mold, and encapsulated with liquid epoxy resin encapsulating material. For electronic circuits formed by this technology, there is currently a shift to package types such as the BGA (Ball Grid Array) connector, in which solder balls are formed that electronically connect to the electronic circuits formed in the electronic components, and the CSP (Chip Size Package), which improves the size reduction of the electronic components, in order to the connect internal electronic circuits and the electronic circuits formed on the motherboard.

Furthermore, recently technology has been proposed that obtains a wafer-sized level package, which promotes the reduction in size of electronic components. In this technology, posts are formed on the wafer itself and a protective coating is formed by resin on the circuitry formed by planer technology on the wafer surface. Then, after forming the solder balls on the posts, a package having a wafer-sized level is obtained by separating each one by dicing. Moreover, the term "post" as used in the present Specification denotes a part that electronically connects the electronic circuits formed in the electronic component and the external electronic circuits formed on the motherboard, for example.

According to this technology, the size of the package of the electronic component is the size of the semiconductor element itself, and thus the external dimensions of the electronic component are minimized. In addition, the electronic component is extremely thin because the encapsulating resin is limited to a thickness matching the height of the posts and the thickness of the semiconductor substrate, and the overall thickness when joined with the connection solder balls remains much smaller than the thickness of the conventional electronic component. Japanese Unexamined Patent Application, First Publication, No. Hei 10-79362, may be referred to for the details of this technology.

However, presently wearable computers are under development. This wearable computer is a computer used by attaching a miniaturized computer to a person in the same manner as an article of clothing. In order to realize this type of electronic device, in the future, small-sized and lightweight electronic devices are necessary.

To meet the need for this small size and light weight, one method that has been conceived is making the wafer itself thinner in order to design electronic components having a further reduced size.

Generally, present semiconductor elements use wafers made of silicon, for example. The thickness of these wafers is 400 microns (0.4 mm) or greater. Generally, the thickness of a six-inch wafer is 625 microns, and the thickness of an eight-inch wafer is 725 microns. Wafers having this degree of thickness are used because silicon, like glass, for example, is fragile when it is thin. That is, with planar technology, the electronic circuits are formed on the semiconductor substrate by the various processes such as doping a part of the substrate with an n-type or p-type dopant, applying and developing a resist for forming the pattern of the electronic circuits, and applying wiring. However, if an extremely thin wafer is used, it may be broken during these processes. Thus, handling a wafer thinner than 0.4 mm is practically impossible. Furthermore, after forming the electronic circuits on the wafer surface using planar technology, attempts have been made to produce a wafer thinner than 400 microns by grinding the back surface of the wafer and then forming bumps and applying an encapsulating material, but handling the thin wafer is difficult in these processes.

However, generally it is said that essentially as long as the depth the electronic circuits is about 20 microns (0.02 mm) below the wafer surface, the wafer will function as an electronic circuit without any problems. Thus, being able to make the thickness of the wafer in which the electronic components are formed less than 0.4 mm would be extremely advantageous when reducing the size of electronic components further.

SUMMARY OF THE INVENTION

In consideration of the above-described problems, it is an object of the present invention to provide a fabrication method for electronic components that allows further reduction in the size of electronic components by making the semiconductor substrate thin, and at the same time, functions as an electronic circuit without problems, and further, has both sufficient durability and a high reliability even when used in a portable electronic device.

In order to attain this these objects, the fabrication method for electronic components of the present invention is characterized in providing a first application process in which an encapsulating resin is applied to a surface on which posts are formed, a back surface grinding process in which the back surface of this substrate is ground, a second application process in which an encapsulating resin is applied to the back surface of the substrate after grinding, and a separation process in which the substrate is cut along with the encapsulating resin and the individual electronic components are separated.

According to the present invention, because there is a process in which the wafer is ground, thinner electronic components can be manufactured. Furthermore, because the wafer is ground when the electronic components are embedded within the substrate and encapsulated, the substrate is not broken, and thin electronic circuits can be manufactured.

In addition, because the encapsulating resin is applied not only to the surface on which posts are formed, but the back surface of the substrate as well, the separation process can be carried out without producing a warping of the substrate, and production defects decrease dramatically.

Furthermore, because the encapsulating resin is applied not only to the surface on which the posts are formed, but the back surface of the substrate as well, both the surface in which electronic circuits are formed as well as the back surface are protected, and highly reliable electronic components that can sufficiently endure external pressure during surface mounting can be manufactured.

In addition, the method of manufacturing electronic components of the present invention is characterized in providing a groove formation process in which grooves are formed in the surface on which posts are formed, a first application process in which an encapsulating resin is applied to the surface in which the grooves are formed, a back surface grinding process in which the back surface of the substrate is ground until the grooves are exposed, a second application process in which encapsulating resin is applied to the back surface of the substrate after grinding, and a separation process in which the encapsulating resin that sufficiently fills the grooves is cut and the individual electronic components are separated.

According to the present invention, because electronic components can be fabricated having the entire substrate in which electronic components are formed encapsulated by the encapsulating resin, and because there are no influences such as moisture absorption from the surrounding atmosphere, the reliability of the electronic components can be made extremely high.

Preferably the above-described invention further has a curing process in which the encapsulating resin applied by the first application process is cured, and in addition, preferably the above-described invention further has a surface grinding process in which the surface to which the encapsulating resin has been applied during the back surface grinding process is ground. Furthermore, preferably the invention further has a curing process in which the encapsulating resin applied by the second application process is cured, and preferably the invention further has a connection ball formation process in which the connection balls are formed on the posts before the separation process.

Here, the connection ball formation process is characterized in comprising a process of screen printing a soldering paste on the posts, and a process of fusing and quenching the screen printed soldering paste.

In addition, the first application process and the second application processes preferably apply the encapsulating resin by screen printing. Furthermore, preferably the thickness of the printing screen used in the second application process should be set according to the curing contraction percentage of the encapsulating resin used in the first application process.

In addition, fabrication method of electronic components of the present invention is characterized in having a first application process in which an encapsulating resin is applied to the surface of the substrate on which the posts are formed, a back surface grinding process in which the back surface of the substrate is ground until the substrate becomes a specified thickness, a groove formation process in which groves from the back surface of the substrate that has been ground to the encapsulating resin applied in the first application process are formed, a second application process in which an encapsulating resin is applied to the back surface of the substrate in which the grooves are formed, and a separation process in which the encapsulating resin that fills the groove part is cut and individual electronic components are separated.

According to this invention, because grooves are formed from the back surface of the substrate after the encapsulating resin is applied to one surface of the substrate, the strength of the entire substrate on which the encapsulating resin has been applied is increased, and there is no concern that the substrate will fracture in subsequent processes.

Here, preferably there are a curing process in which the encapsulating resin that was applied by the second application process is pressure cured and a front surface grinding process in which the surface on which the encapsulating resin has been applied is ground before the back surface grinding process. In addition, there is a further connection ball formation process in which connection balls are formed for the posts before the separation process.

DETAILED DESCRIPTION OF THE PREFERRED EMBODIMENTS

Figure 1:
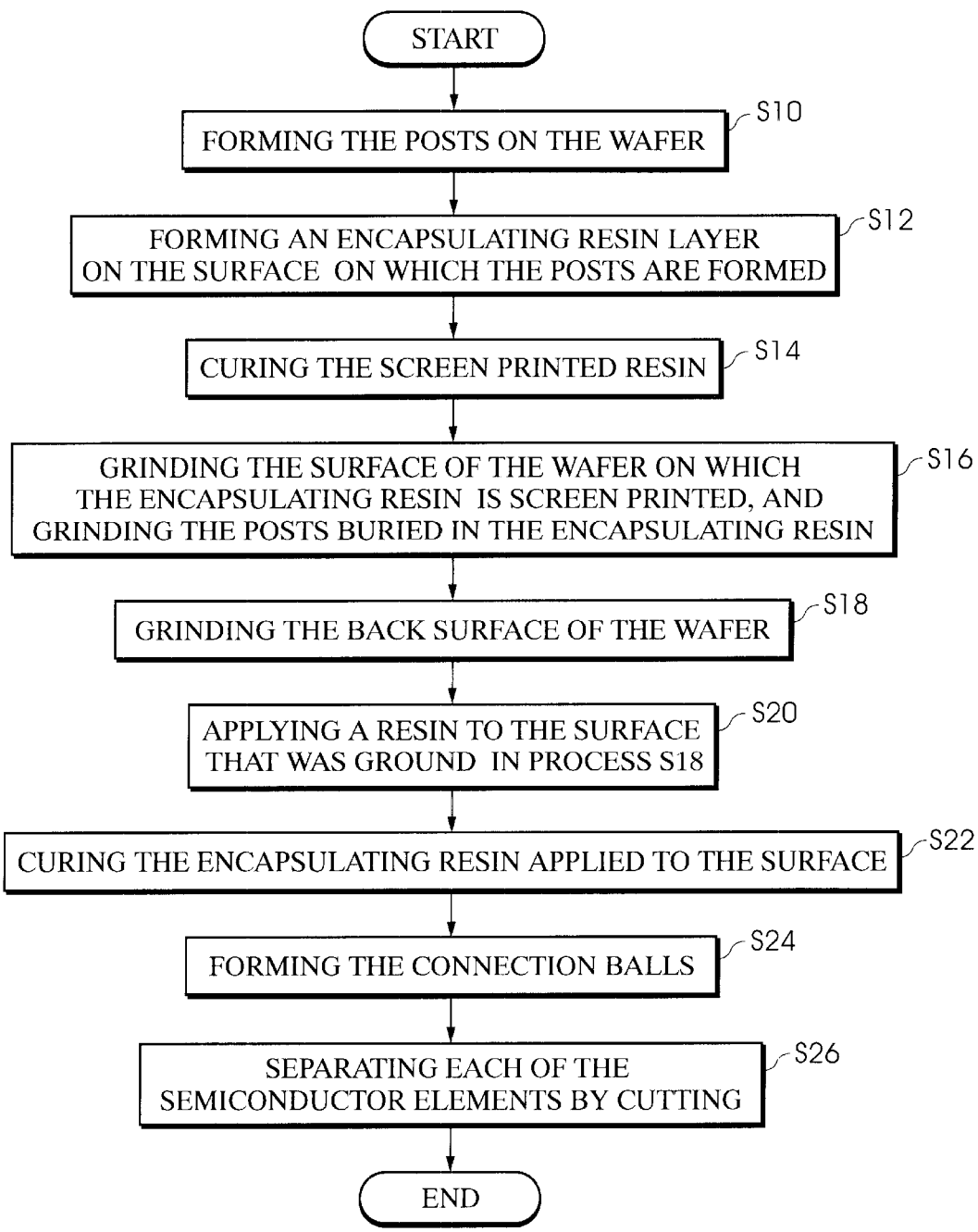
FIG. 1 is a drawing showing the order of processes of the fabrication method for electronic components according to the first embodiment of the present invention.

Below, a method for fabricating electronic components according to the preferred embodiments of the present invention will be explained in detail referring to the drawings.

First Embodiment

FIG. 1 is a drawing for explaining the order of processes for the method of manufacturing electronic components according to the first embodiment of the present invention.

First, the process (process S10) of forming the posts on the wafer in which the electronic circuits have been formed using planar technology is carried out.

Figure 2:
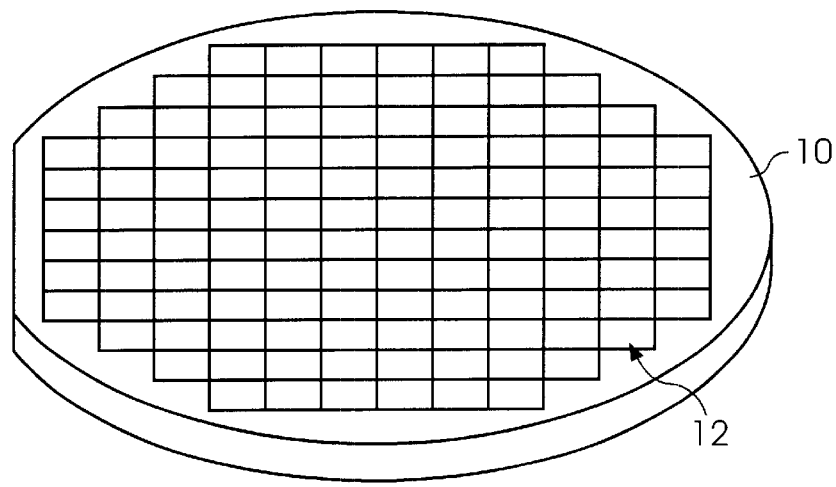
FIG. 2 is a perspective drawing showing an example of a wafer in which electronic components are formed by planar technology.

FIG. 2 is a perspective drawing showing an example of a wafer in which the electronic circuits have been formed using planar technology. As shown in FIG. 2, on the surface of a wafer 10, the semiconductor elements 12 are formed. Normally, on one wafer 10, semiconductor elements 12, in which identical electronic circuits are formed, are formed in plurality. The thickness of the wafer 10 is equal to or greater than 0.4 mm. On each of the surfaces of the semiconductor elements 12, an insulating layer using, for example, silicon oxide film, is formed, and the locations on which the electrode pads that connect the electronic circuits formed in the semiconductor element 12 and the external electronic circuits are exposed by removing the silicon oxide film by, for example, etching.

The posts are formed at the locations exposed by removing the silicon oxide film by etching, etc.

Figure 3:
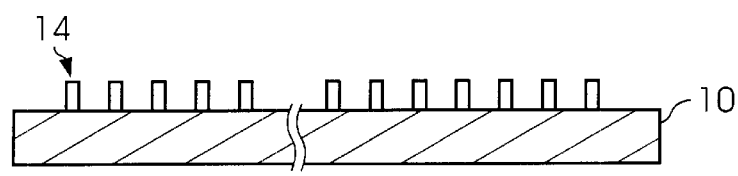
FIG. 3 is a cross-sectional drawing of the wafer 10 in the first embodiment.

FIG. 3 is a cross-sectional drawing of the wafer 10. As shown in FIG. 3, a plurality of posts 14 are formed in plurality on a semiconductor element 12 of the wafer 10. The fabrication method of the posts 14 is not limited in particular, but for example solder balls can be disposed using a transfer method.

When the posts 14 have been formed, next a process (process S12) is carried out that forms an encapsulating resin layer on the surface on which the posts 14 are formed.

Figure 4:
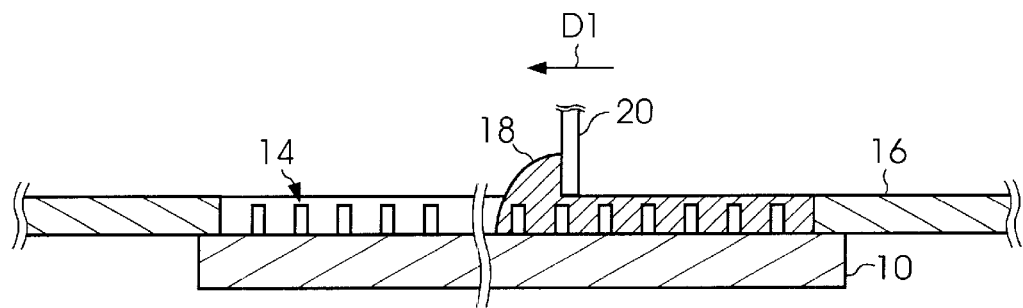
FIG. 4 is a drawing for explaining the process of forming the encapsulating resin layer on the surface on which the posts 14 are formed in the first embodiment.

FIG. 4 is a drawing for explaining the process of forming the encapsulating resin layer on the surface on which the posts 14 are formed.

In FIG. 4, reference numeral 16 is the printing screen, and in this printing screen, a hole is formed for screen printing one time the semiconductor elements 12 formed in the wafer 10. The diameter of the hole is slightly smaller than the diameter of the wafer. Reference numeral 18 is a liquid encapsulating resin used when carrying out encapsulating. The liquid encapsulating resin 18 preferably reduces to a minimum the warping of the wafer 10 after curing.

For example, when the diameter is 8 inches, a liquid encapsulating resin is applied to the wafer having a thickness of 400 $\mu$m, and this liquid encapsulating resin has been hardened, preferably the warping of the wafer is equal to or less than 1 mm. As a liquid encapsulating resin 18, NPR-785 N made by Nihon Rekku K. K. is most suitable. NPR-785 N includes a silica powder in the resin curing component at 80 wt. %, has a curing contraction percentage equal to or less than 0.1%, and has a thermal expansion coefficient equal to or less than 12 ppm.

In addition, reference numeral 20 is a squeegee that can move in both directions on the printing screen 16.

When screen printing is carried out, first, the printing screen 16 is disposed so as to contact the upper surface of the wafer 10. At this time, the printing screen 16 is disposed so that the hole formed in the printing screen 16 is positioned above the semiconductor element 12. That is, the printing screen 16 is disposed so that the printing screen 16 does not cover the semiconductor elements 12. Next, the liquid encapsulating resin 18 is deposited on the printing screen 16, and the squeegee 20 is moved along the printing screen 16 in the direction denoted by the reference symbol D1. By moving the squeegee 20 along the printing screen 16, the liquid encapsulating resin 18 flows into the hole formed in the printing screen 16, and at the same time, the upper surface of the liquid encapsulating resin 18 that has flowed into the hole assumes a height equal to that of the printing screen 16, and has a flat surface.

Next, the relationship between the thickness of the printing screen 16 and the height of the posts 14 that determines the position of the upper surface of the liquid encapsulating resin 18 will be explained.

Figure 5A:
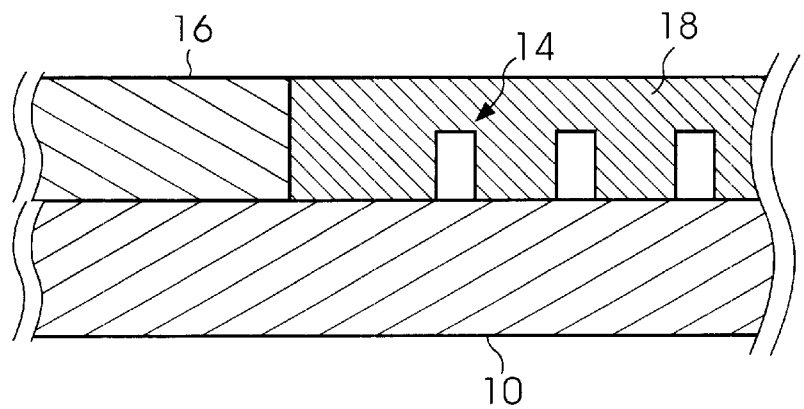
FIG. 5A is a cross-sectional drawing showing the state after sealing the liquid encapsulating resin 10 using a printing screen that is thicker than the height of the posts 14 in the first embodiment.
Figure 5B:
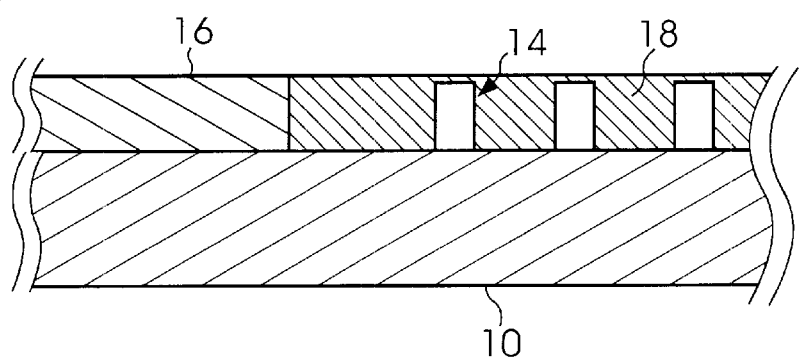
FIG. 5B is a cross-sectional drawing showing the state after sealing the encapsulating resin 10 using a printing screen whose thickness is equal to the height of the posts 14 in the first embodiment.
Figure 5C:
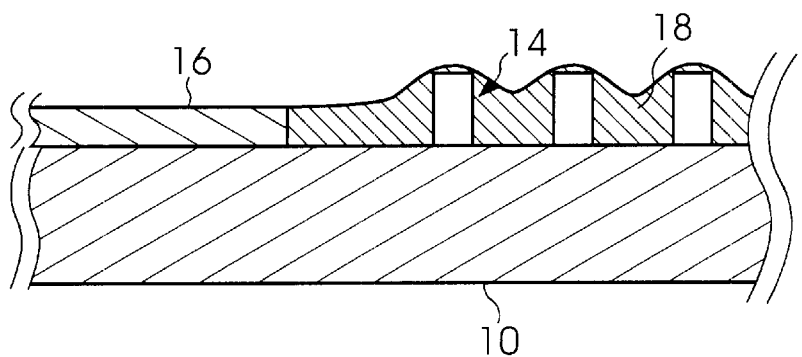
FIG. 5C is a cross-sectional drawing showing the state after sealing the encapsulating resin 10 using a printing screen that is thinner than the height of the posts 14 in the first embodiment.

FIGS. 5A, 5B, and 5C are drawings for explaining the relationship between the thickness of the printing screen 16 and the posts 14.

In the present embodiment, the thickness of the printing screen 16 is not limited to being higher than the height of the posts 14. For example, FIG. 5A is a cross-sectional figure showing the state after sealing with the liquid encapsulating resin 18 using a printing screen 16 whose thickness is greater than the height of the posts 14; FIG. 5B is a cross-sectional figure showing the state after sealing with the liquid encapsulating resin 18 using a printing screen 16 having a thickness equal to the height of the posts 14; and FIG. 5C is a cross-sectional figure showing the state after sealing with the liquid encapsulating resin 18 using a printing screen 16 that is thinner than the height of the posts 14.

As shown in FIG. 5C, in the case of using a printing screen 16 that is thinner than the height of the posts 14, the posts 14 project due to using a squeegee 20 that flexibly deforms (made of rubber, for example), and furthermore, the encapsulating resin is applied in proximity to the posts.

Moreover, the screen printing performed in process S12 is not limited to being performed one time, but can be carried out a plurality of times on a single wafer. In addition, the screen printing of the encapsulating resin 18 can be carried out below atmospheric pressure or in a vacuum state, but preferably the screen printing is carried out in a vacuum state.

In the case that screen printing is carried out below atmospheric pressure, the screen printing is preferably carried out under heat. The reason is that when the screen printing is carried out, air bubbles caught in the encapsulating resin 18 are difficult to remove.

Next, in process S14 (process S14), a process that cures the screen printed resin is carried out. This process cures by baking the encapsulating resin 18 in, for example, a hot gas dryer (not shown).

By undergoing the above processes, protection of the circuit can be implemented by the cured film of the encapsulating resin 18, and at the same time, the posts are reinforced and the strength of the wafer further is increased.

Next, a process (process S16) is carried out in which the surface of the wafer 10 on which the encapsulating resin 18 is screen printed is ground, and the posts 14 buried in the encapsulating resin 18 are ground.

Figure 6:
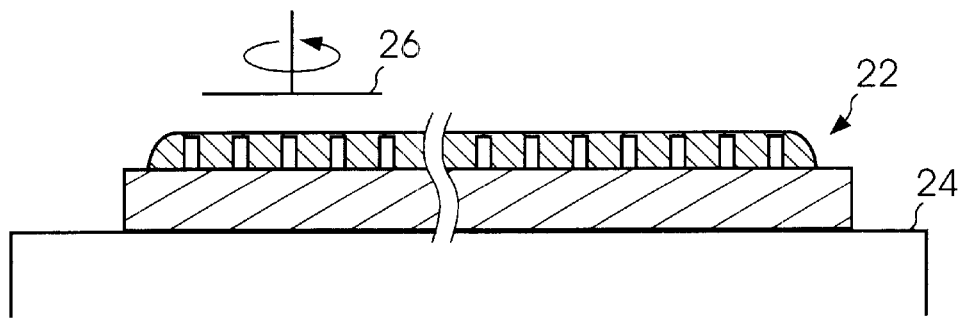
FIG. 6 is a drawing for explaining the process of grinding the posts 14 in the first embodiment.

FIG. 6 is a drawing for explaining the process in which the posts 14 are ground. Moreover, in FIG. 6, in order to facilitate understanding, the drawing of the cross-section shows only electronic component that has been manufactured by carrying out the processes up to process S14, and this is denoted by reference numeral 22.

As shown in FIG. 6, the electronic component 22 is anchored and mounted on an anchoring plate 24 such that the surface with the screen printed encapsulating resin 18 is face up. During grinding, this anchoring plate 24 preferably holds the electronic component 22 by vacuum suction so that the electronic component 22 is stationary on the anchoring plate 24.

In FIG. 6, reference numeral 26 is the grinding apparatus. Any standard wafer grinding apparatus can be used for this grinding apparatus.

In this process, after anchoring the electronic component 22 on the anchoring plate 24, the encapsulating resin 18 is ground by the grinding apparatus 26, and in addition, if necessary, forms a smooth surface by grinding the posts as well.

Next, when the grinding of the encapsulating resin 18 is finished, a process (process S18) is carried out in which the back surface of the electronic component 22, that is, the back surface of the wafer 10, is ground.

Figure 7:
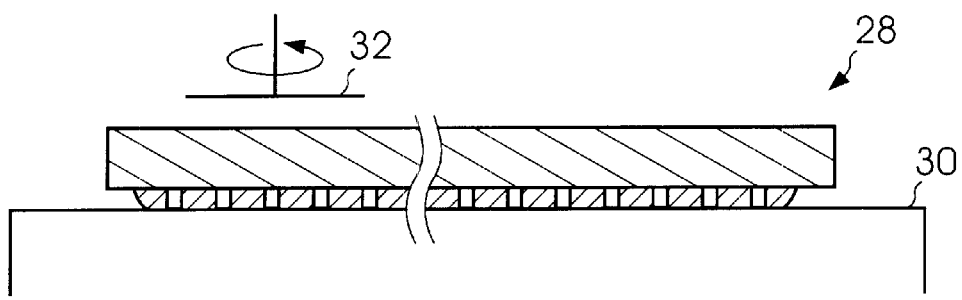
FIG. 7 is a drawing for explaining the process of grinding the back surface of the electronic component 22 in the first embodiment.

FIG. 7 is a drawing for explaining the process in which the back surface of the electronic component 22 is ground.

In this process, as shown in FIG. 7, the surface that was ground in process S16 is turned to face down, and is anchored to an anchoring fitting 30. This anchoring fitting 30, like the anchoring plate 24 in FIG. 7, preferably carries out vacuum suction. In addition, the anchoring fitting 30 can be identical to the anchoring plate 24 in FIG. 6.

In addition, reference numeral 32 is a grinding apparatus. This grinding apparatus 32 can carry out grinding by using the grinding apparatus 26 that was used when carrying out the grinding of the encapsulating resin 18 in process S16.

Moreover, in FIG. 7, in order to facilitate understanding, the cross-sectional diagram of only the electronic component fabricated by the processes up to process S16 is shown, and this is are denoted by reference numeral 28.

In this process, after turning over the surface of the electronic component on which the encapsulating resin is screen printed and anchoring it to the anchoring fitting 30, the back surface of the electronic component 28, that is, the back surface of the wafer 10, is ground by the grinding apparatus 32 until the wafer 10 acquires a specified thickness. For example, the overall thickness of the electronic component 28 is ground to 200 $\mu$m.

Figure 8:
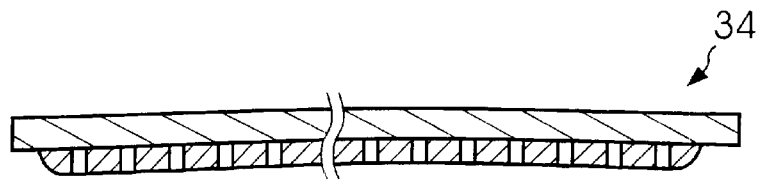
FIG. 8 is a drawing showing an electronic component after grinding both surfaces in the first embodiment.

When the above process is finished, the electronic component is removed from the anchoring fitting 30 after grinding, and the electronic component after grinding is shown in FIG. 8.

FIG. 8 is a cross-sectional drawing showing both surfaces of the electronic component after grinding. Moreover, in FIG. 8, both surfaces of the electronic component after grinding are shown in a cross-sectional drawing, and denoted by reference numeral 34.

The electronic component 34 having both surfaces ground is subject to warping when separated from the anchoring fitting, as shown in FIG. 8. This warping is due to shrinkage when the encapsulating resin screen printed on the surface on which the posts 14 are formed is cured.

Next, in order to lessen the above-mentioned warping and strengthen the electronic component 34, a process (process S20) is carried out in which a resin is applied to the surface that was ground in process S18.

Figure 9:
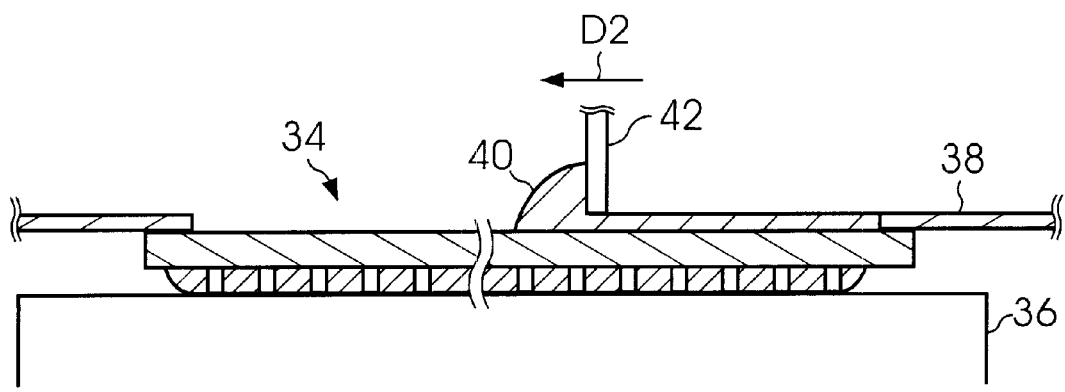
FIG. 9 is a drawing for explaining the process of applying resin on the surface which was ground in process S18 in the first embodiment.

FIG. 9 is a drawing for explaining the process of applying the resin to the surface ground in process S18.

In FIG. 9, reference numeral 36 is a suction anchoring plate that anchors the electronic component 34. This suction anchoring plate 36 is used because warping is produced in the electronic component 34 after grinding both surfaces in the same manner as shown in FIG. 8, in order to flatten the electronic component 34, and in order to make the electronic component 34 stationary during screen printing.

Reference numeral 38 is a printing screen used for carrying out screen printing, and in this printing screen 38, a hole is formed for carrying out screen printing on the back surface of the electronic component 34. The diameter of this hole is slightly smaller than the diameter of the wafer 10. Reference numeral 40 is the liquid encapsulating resin 40 used when carrying out the encapsulating. An encapsulating resin is used that has a contraction stress just sufficient to correct the warping of the electronic component 34 after curing. For example, the encapsulating resin used may be the same as the encapsulating resin 18 used when encapsulating the surface of the wafer on which the posts 14 are formed in process S12. In addition, the warping of electronic components 34 can be controlled by controlling the thickness of the application of the applied encapsulating resin 40. In this case, controlling the thickness of the printing screen 38 can control the thickness of the application.

In addition, as long as the warping of the electronic component 34 can be corrected, the encapsulating resin 40 used can be different from the encapsulating resin 18.

Reference numeral 42 is a squeegee that can move in both directions over the surface of the printing screen 38.

The screen printing can be carried out in the same manner as the process S12 at atmospheric pressure or in a vacuum, but when the reliability of the packaging is a concern, preferably screen printing is carried out in a vacuum.

When carrying out screen printing, first the posts 14 are formed, and after the surface on which the encapsulating resin 18 has been screen printed is faced down, the electrical component 34 is disposed at a specified position on the suction anchoring plate 36. When the electrical component 34 is disposed on the suction anchoring plate 36, it is flattened.

Next, the under surface of the electrical component 34, that is, the under surface of the wafer 10, is disposed in contact with the printing screen 38. When the printing screen 38 is disposed at a specified position, the liquid encapsulating resin 40 is deposited on the printing screen 38, and the squeegee 42 is moved in the direction indicated by arrow D2 along the printing screen 38. By moving the squeegee 42 along the printing screen 38, the liquid encapsulating resin 40 flows into the hole formed by the printing screen 38, and at the same time the upper surface of the liquid encapsulating resin 40 that has flowed into the hole becomes level with the printing screen 38, and the surface becomes flat.

Moreover, the method of applying the encapsulating resin 40 to the back surface of the electrical component 34 is not limited to a printing screen, and other methods can be used to carry out the process. Examples of other methods are spray coating, spin coating, and metal molding.

Next, a process is carried out that cures the encapsulating resin 40 applied in process S20 (process S22). This process, for example, cures the encapsulating resin 40 by drying using a hot air dryer (not illustrated). When this encapsulating resin 40 is cured, warping that has occurred in the electrical component 34 can be corrected.

By passing through the above processes, a cured encapsulating resin 18 and encapsulating resin 40 are formed on the front surface and back surface of an electrical component, and thus the strength of the wafer is increased.

By passing through the processes up to process S22, wafer 10 can be obtained that has a semiconductor element 12 formed in plurality which has respectively screen printed thereon the encapsulating resin 18 in which the posts are formed and the encapsulating resin 40 on the back surface.

Next, a process (process S24) is carried out that forms the connection balls for electrically connecting the electronic circuits formed in the semiconductor element 12 and the electronic circuits formed in the external motherboard (not illustrated).

Figure 10:
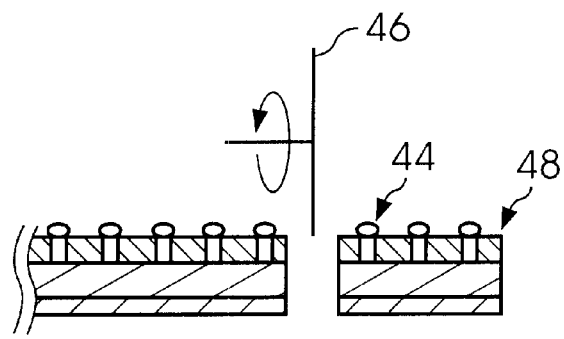
FIG. 10 is a drawing for explaining the process of forming the electronic component by separating the semiconductor element 12 into units in the first embodiment.

In this process, solder balls having a specified diameter are mounted on posts 14 that appear in the surface of the encapsulating resin 18 (refer to FIG. 10).

In order to mount the solder balls 44 on the posts 14, a ball mounter can be used (not illustrated), but when the pitch of the posts is equal to or less than 0.5 mm, a ball having a diameter smaller than 0.3 mm is necessary. Thus, in the case that the pitch is this narrow, rather than mounting the solder balls using a ball mounter, preferably a specified amount of solder paste is precisely deposited on the post 14, and a solder ball 44 is formed through a reflow soldering (not illustrated). In this case, the solder paste is preferably positioned on the posts 14 by screen printing using a special printing screen and squeegee.

In this case, this method of fabrication is possible by steadily supporting the wafer.

Finally, a process (process S26) is carried out in which the electronic component 48 is formed by separating each of the semiconductor elements 12 by cutting.

FIG. 10 is a drawing for explaining the processes in which the electronic components 48 are formed by separating each of the semiconductor elements 12.

In FIG. 10, reference numeral 46 is a dicing apparatus, and to form the electronic component 48, each of the semiconductor elements 12 is separated by using the dicing apparatus 46. Moreover, although cutting can carried out using a standard dicing apparatus, a laser cutting apparatus that uses a laser can also be used.

Above, the fabrication method of electronic components according to the first embodiment of the present invention has been explained.

In processes S12 and S20, encapsulating resin 18 and encapsulating resin 40 are screen printed, but after these processes, a process should be provided that eliminated bubbles that are mixed into screen printed encapsulating resin 18 and encapsulating resin 40.

The inventors of the present application have actually reduced to practice the above-described embodiment. Below, the results of this reduction to practice will be explained.

In the present embodiment, a wafer having a thickness of 725 $\mu$m and a diameter of 8 inches was used, and posts having a $\phi$ of 0.2, a height of 100 $\mu$m, and a pitch of 0.4 mm were formed on this wafer. In addition, the encapsulating resins 18 and 40 used in process S12 and process S20 in FIG. 1 were the NPR-785N resin manufactured by Nihon Rekku, K. K. This resin contained 80 wt. % silicon powder in the resin curing component, the curing contraction percentage was equal to or less than 0.1%, and the thermal expansion coefficient is equal to or less than 12 ppm.

In addition, the screen printing apparatus used the vacuum printing screen printer VPES manufactured by Nihon Rekku, K. K. The printing screen used in this screen printing was a stainless steel printing screen, and was provided with an opening part (hole) of 7.6 inches. In addition, the thickness of the printing screen 16 used in process S20 was 0.1 mm and the thickness of the printing screen 38 used in process S20 was 0.05 mm.

In addition, in process S24, the method for forming the connection balls used a solder paste. In this method, solder paste was screen printed on the electronic component. In this case, the printing screen used in screen printing was a stainless steel printing screen having a thickness of 0.15 mm, and opening parts with a φ of 0.15 and a pitch of 0.4 mm, which were positioned so as to correspond to the posts 14. In addition, the squeegee used at this time was a rubber squeegee having a hardness of 90°.

The encapsulating resin was screen printed on the wafer surface on which the above-described posts have been formed, but in the vacuum printing screen printer VPES, the screen printing was carried out setting the air pressure vacuum at 133 pa and using a printing screen having a thickness of 0.1 mm. Subsequently, after returning to atmospheric pressure, the electronic component whose screen printing has finished was extracted from the vacuum printing screen printer VPES, and the encapsulating resin was cured by being dried at 100° C. for 1 hour, and then being dried at 150° C. for 3 hours.

The warping of the wafer after curing the encapsulating resin was 50 μm at the edge.

Next, the surface was smoothed by grinding to 25 μm the surface screen printed with encapsulating resin, and at the same time the surface of the posts were polished. At this point in time, the total thickness of the electronic component was 800 μm.

Next, this electronic component was turned over and the back surface of the electronic component, that is, the back surface of the wafer was ground down 600 μm. The total thickness of the electronic component after grinding the back surface of the electronic component was 200 μm. In addition, the warping of the electronic component as this time was 120 μm.

Next, on the ground back surface of the electronic component in the above-described VPES, using a printing screen having a thickness of 0.05 mm, the same NPR-785N was screen printed using the printing screen, and cured below atmospheric pressure under the same curing conditions.

After the screen printing of the encapsulating resin on both surfaces of the wafer, the warping produced in the electronic components was 2 μm.

Subsequently, the surface on which the posts were formed was again turned up by reversing the wafer, and in the VPES using the printing screen for the above-described solder paste, the solder paste was supplied and screen printed on the posts.

Subsequently, by melting and quenching the solder paste by passing it through a reflow furnace, the solder balls were formed above the posts.

The height of the formed solder balls was 0.15 mm.

Finally, each package was cut and separated by dicing, and a chip-sized packages could be obtained having a thickness of 250 μm, excluding the balls.

Second Embodiment

Below, a fabrication method for electronic components according to the second embodiment of the present invention is explained referring to the drawings.

Figure 11:
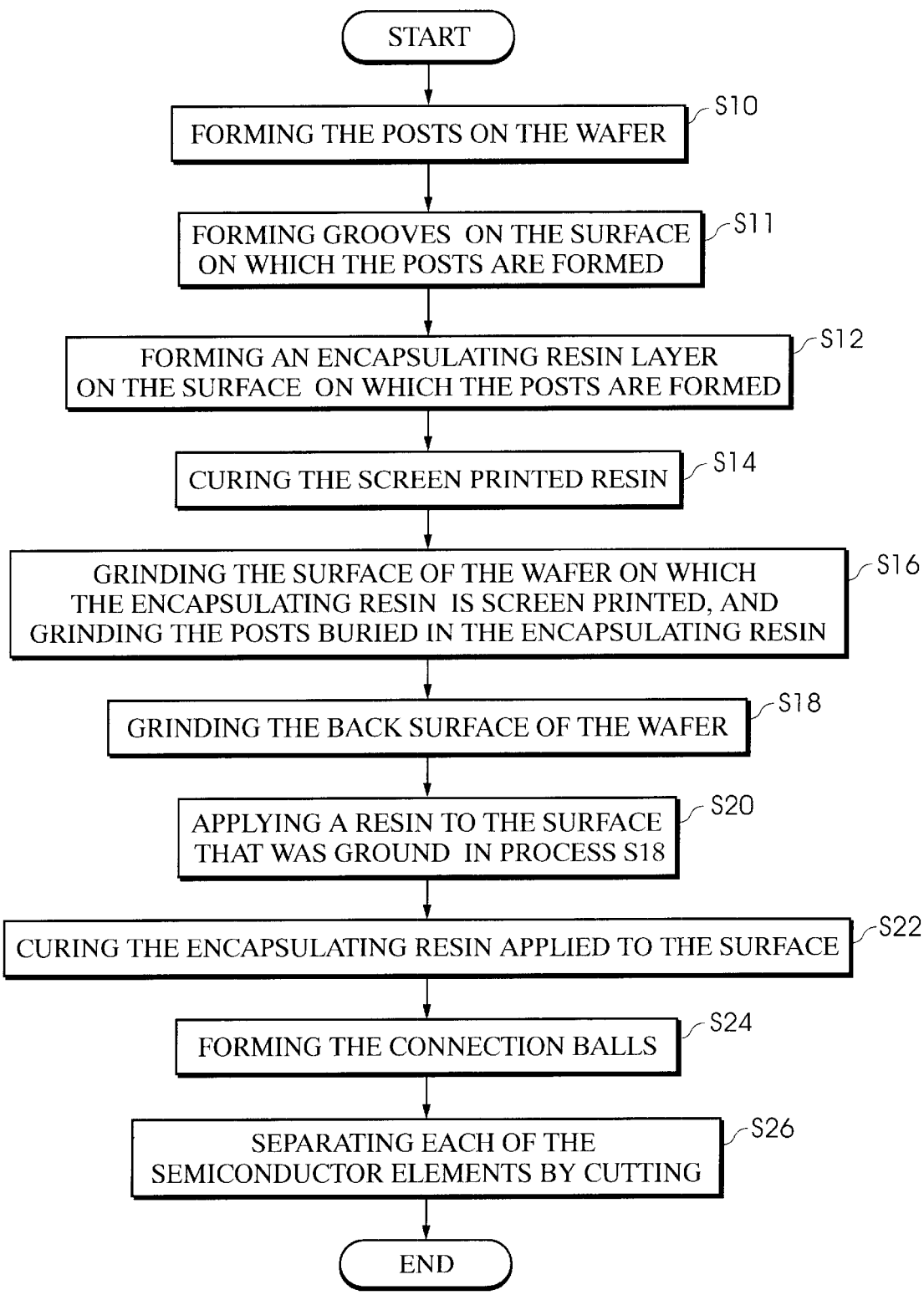
FIG. 11 is a drawing showing the order of processes of the fabrication method for electronic components according to the second embodiment of the present invention.

FIG. 11 is a drawing showing the order of the processing of the fabrication method for electronic components according to the second embodiment of the present invention. The fabrication method for electronic components according to the second embodiment of the present invention shown in FIG. 11 differs from the fabrication method for electronic components according to the first embodiment of the present invention shown in FIG. 1 in that a process S11 is provided between process S10 and process S12. Below, the fabrication method of electronic components according to the second embodiment of the present invention shown in FIG. 11 will be explained in detail. In process S10, a process is carried out in which posts are formed on the wafer in which the electronic components have been formed by planar technology. The wafer used here is the wafer 10 in which semiconductor elements 12 are formed in plurality in the same manner as the wafer used in the first embodiment shown in FIG. 2.

Figure 12:
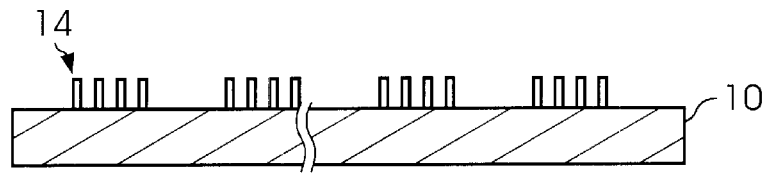
FIG. 12 is a cross-sectional drawing of the wafer 10 in the second embodiment.

FIG. 12 is a cross-sectional drawing of the wafer 10. As shown in FIG. 12, on the semiconductor elements 12 of the wafer 10 a plurality of posts 14 are formed. The method of forming the posts 14 is not particularly limited, but for example solder balls can be disposed using a transfer method.

When the posts 14 are formed, next a process (process S11) is carried out in which grooves are formed on the surface on which the posts are formed.

Figure 13:
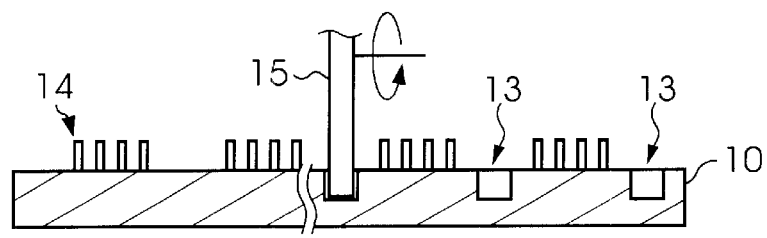
FIG. 13 is a drawing for explaining the process of forming the grooves on the surface on which the posts 14 are formed in the second embodiment.

FIG. 13 is a drawing for explaining the process in which grooves are formed in the surface on which the posts 14 are formed, and shows the same cross-section for the wafer 10 as is shown in FIG. 3.

In FIG. 13, reference numeral 15 is a dicing apparatus for forming the grooves, and in the present embodiment, for example, a dicing apparatus that forms grooves having a width of 0.05 to 0.4 mm is used. As described above, on one wafer 10, semiconductor elements 12 are formed in plurality, and thus these grooves are formed so as to surround the periphery of each semiconductor element. In FIG. 13, reference numerals 13, 13, . . . denote the grooves formed in the surface of the wafer 10 on which the posts 14 are formed. The depth of these grooves 13, 13, . . . is set from about half the thickness of the wafer to completely cutting the wafer 8 (in this case, an adhesive sheet that can endure the resin curing temperatures is attached to the back surface), and for example, in the case that the thickness of the wafer 10 is 0.6 mm and the width is 0.05–0.4 mm, the grooves are formed having a depth of 0.3–0.6 mm. However, in the figure, the case in which the grooves equal half the thickness of the wafer is explained.

When the grooves 13, 13, . . . have been formed, next a process (process S12) is carried out in which an encapsulating resin layer is formed on the surface on which the posts 14 are formed.

Figure 14:
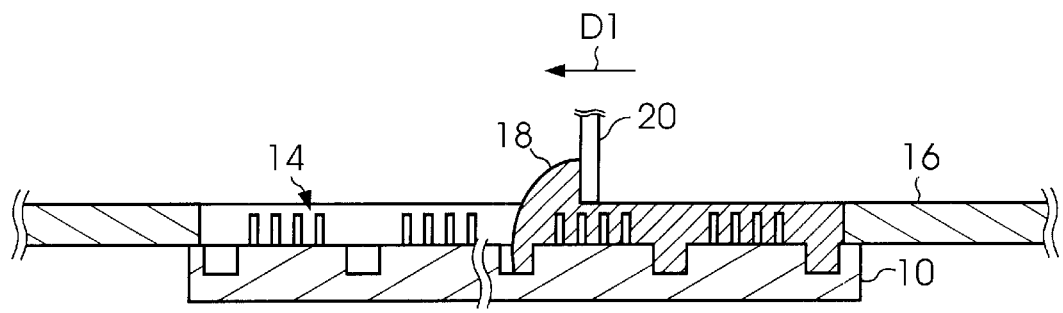
FIG. 14 is a drawing for explaining the process of forming the encapsulating resin layer on the surface on which the posts 14 are formed in the second embodiment.

FIG. 14 is a drawing for explaining the process in which the encapsulating resin layer is formed on the surface on which the posts 14 are formed. In process S14, using the printing screen 16 and the squeegee 20 explained using FIG. 4, the encapsulating resin 18 is screen printed on the surface of the semiconductor element 12. Next, the relationship between the height of the printing screen that determines the position of the liquid encapsulating resin 18 on the surface and the height of the posts 14 will be explained.

FIG. 15 is a drawing for explaining the relationship between the height of the printing screen 16 and the height of the posts 14.

Figure 15A:
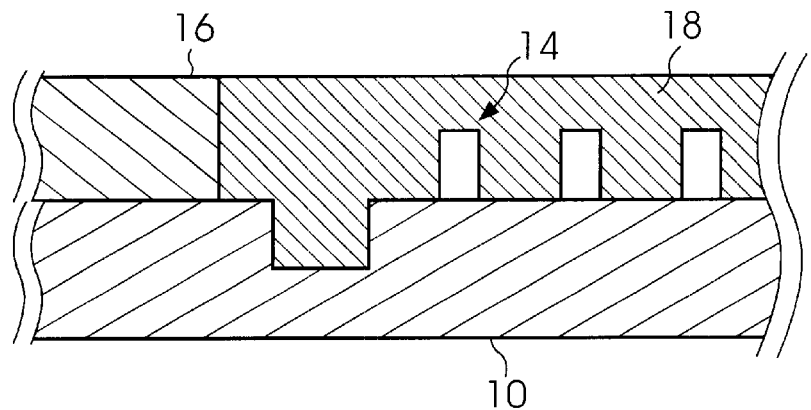
FIG. 15A is a cross-sectional drawing showing the state after sealing the liquid encapsulating resin 18 using the printing screen 16 that is thicker than the height of the posts 14 in the second embodiment.
Figure 15B:
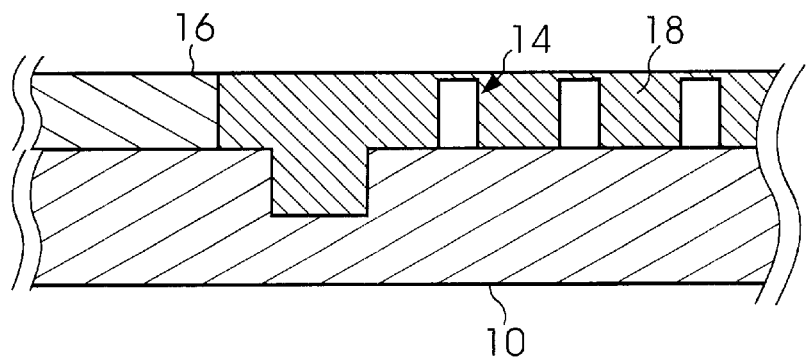
FIG. 15B is a cross-sectional drawing showing the state after sealing the liquid encapsulating resin 18 using the printing screen 16 whose thickness is equal to the height of the posts 14 in the second embodiment.

In the present embodiment, the thickness of the printing screen 16 is not limited to being higher than the height of the posts 14. For example, FIG. 15A is a cross-sectional figure showing the state after sealing with the liquid encapsulating resin 18 using a printing screen 16 whose thickness is greater than the height of the posts 14; FIG. 15B is a cross-sectional figure showing the state after sealing with the liquid encapsulating resin 18 using a printing screen 16 having a thickness equal to the height of the posts 14; and FIG. 15C is a cross-sectional figure showing the state after sealing with the liquid encapsulating resin 18 using a printing screen 16 that is thinner than the height of the posts 14.

Figure 15C:
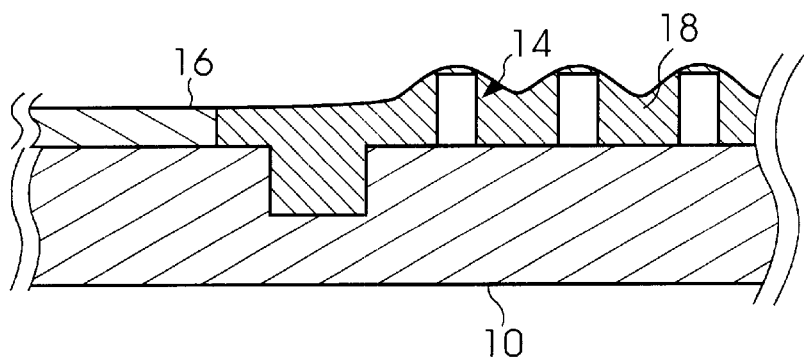
FIG. 15C is a cross-sectional drawing showing the state after sealing the liquid encapsulating resin 18 using the printing screen 16 that is thinner than the height of the posts 14 in the second embodiment.

As shown in FIG. 15C, in the case of using a printing screen 16 that is thinner than the height of the posts 14, the posts 14 project due to using a squeegee 20 that flexibly deforms (made of rubber, for example), and furthermore, the encapsulating resin is applied in proximity to the posts. Moreover, as in the first embodiment, the screen printing performed in process S12 is not limited to being performed one time, but can be carried out a plurality of times on a single wafer. In addition, the screen printing of the encapsulating resin 18 can be carried out below atmospheric pressure or in a vacuum state, but preferable the screen printing is carried out in a vacuum state. When carried out under atmospheric pressure, preferably screen printing is carried out while heating.

In addition, when carrying out screen printing of the liquid encapsulating resin 18, a vacuum screen printer that can fill the encapsulating resin 18 in the grooves 13, 13, . . . by using a pressure differential is preferably used. The reason is that, as stated above, the grooves 13, 13, . . . formed on the wafer 10 have a width of 0.05–0.4 mm, and a depth of 0.3–0.6 mm, and in order to screen print the liquid encapsulating resin 18, the width is narrow and the depth is deep. Thus, when screen printing is carried out under atmospheric pressure, that there is a high probability that parts may be produced that are not filled with the encapsulating resin 18 at the bottom of the grooves.

Next, in process S12, a process (process S14) is carried out in which the screen printed resin is cured. This process cures the encapsulating resin 18 by drying using for example a hot air dryer (not illustrated).

Moreover, during screen printing, as described above, preferably the encapsulating resin 18 is screen printed by using a pressure differential, but because of the higher degree of completeness of the filling by the encapsulating resin 18 in the grooves 13, 13, . . . , in this process, which is carried out after screen printing, the encapsulating resin 18 is preferably cured by applying a pressure greater than atmospheric pressure, which is called pressure curing. When curing the encapsulating resin 18, the temperature of the hot air dryer is set between 100–150° C., and at the same time, the drying time starts by being set to 1–3 hours, but when the drying commences, the applied pressure is set to $5 \times 10^5 - 2 \times 10^6$ pa, and pressure curing is carried out at least until the encapsulating resin 18 gels.

By passing through the above processes, protection of the circuits by the film comprising the cured encapsulating resin 18 can be implemented, and at the same time, the posts are reinforced, and the strength of the wafer 10 is further increased.

Figure 16:
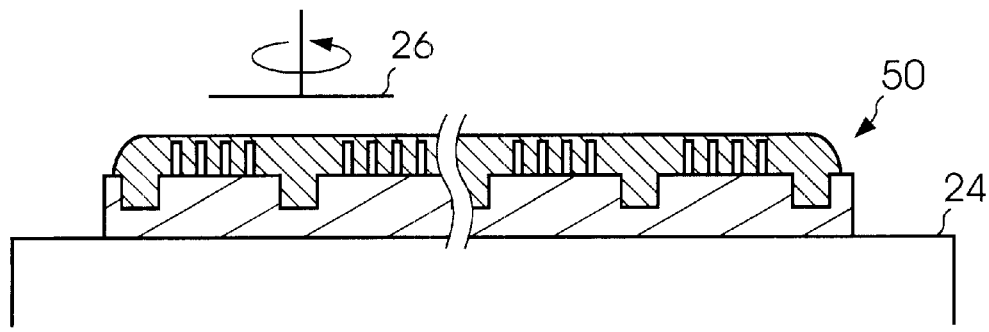
FIG. 16 is a drawing for explaining the process of grinding the posts 14 by in the second embodiment.

Next, a process (process S16) is carried out in which the surface on which the encapsulating resin 18 has been screen printed on the wafer 10 is ground, and the posts 14 buried in the encapsulating resin are ground. FIG. 16 is a drawing for explaining the process of grinding the posts 14. Moreover, to facilitate understanding, only the electronic component fabricated by carrying out the processes up to process S14 is shown in the cross-section, and this is indicated by reference numeral 50.

As shown in FIG. 16, the electronic component 50 is anchored and mounted on the anchoring plate 24 so that the surface in which the encapsulating resin 18 has been screen printed is facing up. This flat plate 24 preferably vacuum attaches the electronic component 50 so that it is stationary on the anchoring plate 24 during grinding. During grinding, the grinding apparatus 26 used is identical to the grinding apparatus 26 used in the first embodiment.

Next, when the grinding of the encapsulating resin 18 is complete, a process (process S18) is carried out in which the back surface of the electronic component 50, that is, the back surface of the wafer 10, is ground.

Figure 17:
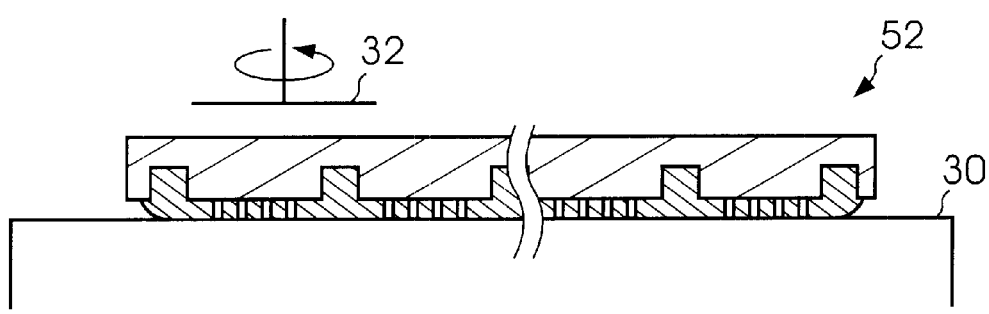
FIG. 17 is a drawing for explaining the process of grinding the back surface of the electronic component 50 in the second embodiment.

FIG. 17 is a figure for explaining the process in which the back surface of the electronic component 50 is ground.

In this process, as shown in FIG. 17, the surface which has been ground in process S16 is anchored to an anchoring fitting 30 facing down. This anchoring fitting 30 preferably uses vacuum attachment similar to the anchoring plate 24 in FIG. 16. In addition, reference numeral 32 is a grinding apparatus. This grinding apparatus 32 can carry out grinding using a grinding apparatus 26 used when carrying out grinding of the encapsulating resin 18 in process S16. Moreover, in FIG. 17, to facilitate understanding, only the electronic component fabricated by carrying out the processes up to process S16 is shown in the cross-sectional drawing, and this part is indicated by reference numeral 52 indicates this part. In this process, the surface on which the encapsulating resin of the electronic component 52 was screen printed is anchored to the anchoring fitting 30 face down, and thus the back surface of the electronic component 52, that is, the back surface of the wafer 10, is ground by the grinding apparatus 32 to reduce the thickness of the wafer 10 to about half or to an arbitrary thickness.

Figure 18:
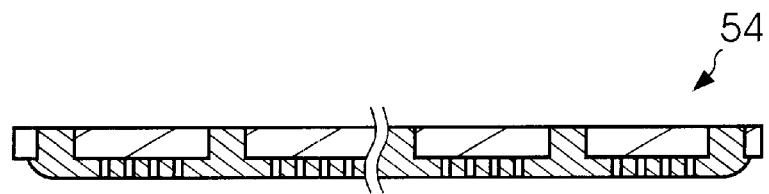
FIG. 18 is a drawing showing the electronic component after both surfaces have been ground in the second embodiment.

When the above process is finished after grinding, the electronic component is removed from the anchoring fitting 30, and the electronic component after grinding is shown in FIG. 18.

FIG. 18 is a drawing that shows both the electronic component surfaces after they have been ground. Moreover, in FIG. 18, the electronic component having both surfaces ground is shown in cross-section, and this is indicated by reference numeral 54.

When the electronic component 54 having both surfaces ground is ground until the thickness of the wafer 10 is reduced to about half, the grooves formed in process S11 appear in the ground surface, and as a result, the encapsulating resin 18 filled into the grooves 13 appears in the ground surface. In addition, when the electronic component 54 is separated from the anchoring fitting 30 in FIG. 17, warping occurs. This warping is caused by shrinkage due to the curing of the encapsulating resin that is screen printed on the surface on which the posts 14 have been formed.

Next, in order to ameliorate this warping and cure the electronic component 54, a process (process S20) is carried out in which a resin is applied to the surface that was ground in process S18.

Figure 19:
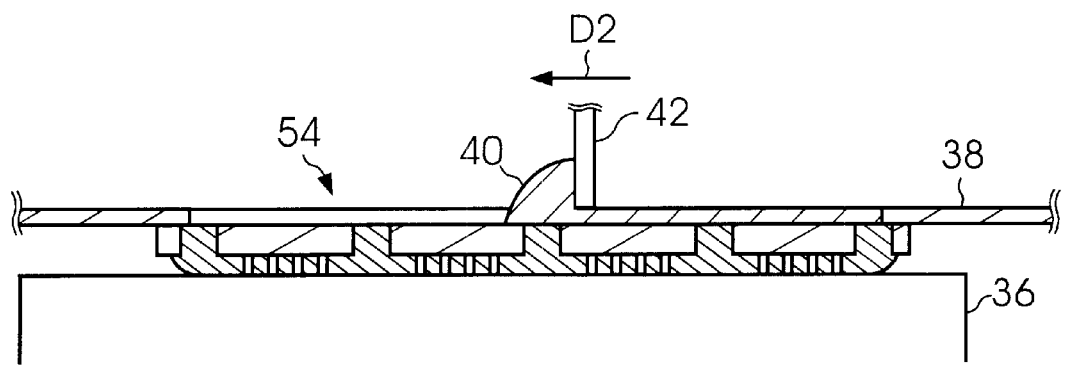
FIG. 19 is a drawing for explaining the process of applying resin to the ground surface in process S18 in the second embodiment.

FIG. 19 is a drawing for explaining the process in which resin is applied to the surface that was ground in process S18.

In FIG. 19, reference numeral 36 is a suction anchoring plate that anchors the electronic component 54. This suction anchoring plate 36 is used in order to flatten the electronic component 54 when warping occurs in the electronic component 54 which is ground on both sides, and in order to anchor the electronic component 54 so as to keep it stationary during screen printing. In this process, the printing screen 38 and the squeegee 42 shown in FIG. 9 are used and screen printing of the encapsulating resin 40 is carried out. The encapsulating resin 40 that is used has a contraction stress just sufficient to correct the warping of the electronic component 54 after curing. For example, process S12 uses a resin which is identical to the encapsulating resin 18 used when encapsulating the surface of the wafer on which the posts 14 are formed in process S12. In addition, the warping of the electronic component 54 can also be controlled by controlling the thickness of the application of the applied encapsulating resin 40. In addition, as long as the warping of the electronic component 54 can be corrected, an encapsulating resin different from the encapsulating resin 40 and the encapsulating resin 18 can be used. Moreover, the screen printing can be carried out under atmospheric pressure or in a vacuum, as in process S12, but when considering the reliability of the packaging, screen printing is preferably carried out in a vacuum. Moreover, the method of application of the encapsulating resin 40 to the back surface of the electronic component 54 is not limited to screen printing with a printing screen, but can be carried out with other methods. For example, spray coating, spin coating, and metal molding can be used.

Next, a process (process S22) is carried out in which the encapsulating resin 40 applied in process S20 is cured. This process cures the encapsulating resin 40 by for example using a hot air dryer (not illustrated). When this encapsulating resin 40 is cured, warping that occurs in the electronic component can be corrected.

By passing through the above processes, the encapsulating resin 18 and the encapsulating resin 40 that are cured on the front surface and the back surface of the electronic component are formed, and thus the strength of the wafer 10 is increased.

By passing through the process up to process S22, a wafer 10 can be obtained in which the semiconductor elements 12, on which the encapsulating resin on the surface in which the posts 14 are formed and the encapsulating resin 40 on the back surface are respectively screen printed, can be formed in plurality.

Next, a process (process S24) is carried out in which connecting balls are formed for electrically connecting the electronic circuits formed in the semiconductor elements 12 and the electronic circuits formed in the external motherboard (not illustrated).

Figure 20:
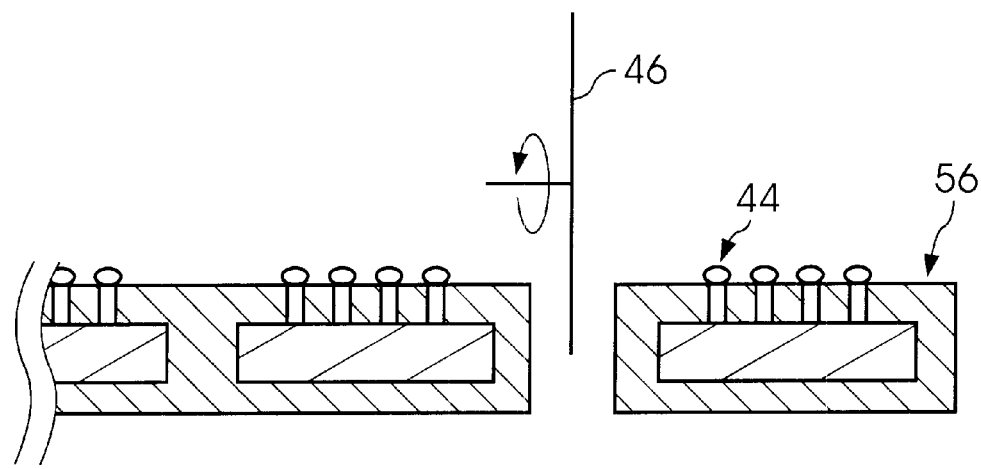
FIG. 20 is a drawing for explaining the process of forming the electronic component 56 by separating the semiconductor elements 12 into units in the second embodiment.

In this process, the solder balls having a specified diameter are mounted on the posts 14 that appear in the surface of the encapsulating resin 18 (refer to FIG. 20).

In order to mount the solder balls 44 on the posts 14, a ball mounter can be used (not illustrated), but when the pitch of the posts is equal to or less than 0.5 mm, a ball having a diameter smaller than 0.3 mm is necessary. Thus, in the case that the pitch is this narrow, rather than mounting the solder balls using a ball mounter, preferably a specified amount of solder paste is precisely deposited on the posts 14, and a solder ball 44 is formed through reflow soldering (not illustrated). In this case, the solder paste is preferably positioned on the posts 14 by screen printing using a special printing screen and squeegee.

In this case, this method of fabrication is possible by steadily supporting the wafer.

Finally, a process is carried out in which the electronic components 56 are formed by separating each of the semiconductor elements 12 by cutting the electronic component (process S26).

FIG. 20 is a drawing for explaining the process in which the electronic components 56 are formed by separating each of the semiconductor elements 12.

In FIG. 20, reference numeral 46 is a dicing apparatus, and to form the electronic component, each of the semiconductor elements 12 is separated by using the dicing apparatus 46. When cutting is carried out using the dicing apparatus 46, the grooves 13 formed in process S11 are cut substantially in the middle. That is, in this process, by cutting only the encapsulating resin 18 electronic components 56 can be obtained. The top, bottom, and four surface surfaces of the electronic components obtained in this manner are all encapsulated by the encapsulating resins 18 and 40.

Figure 21:
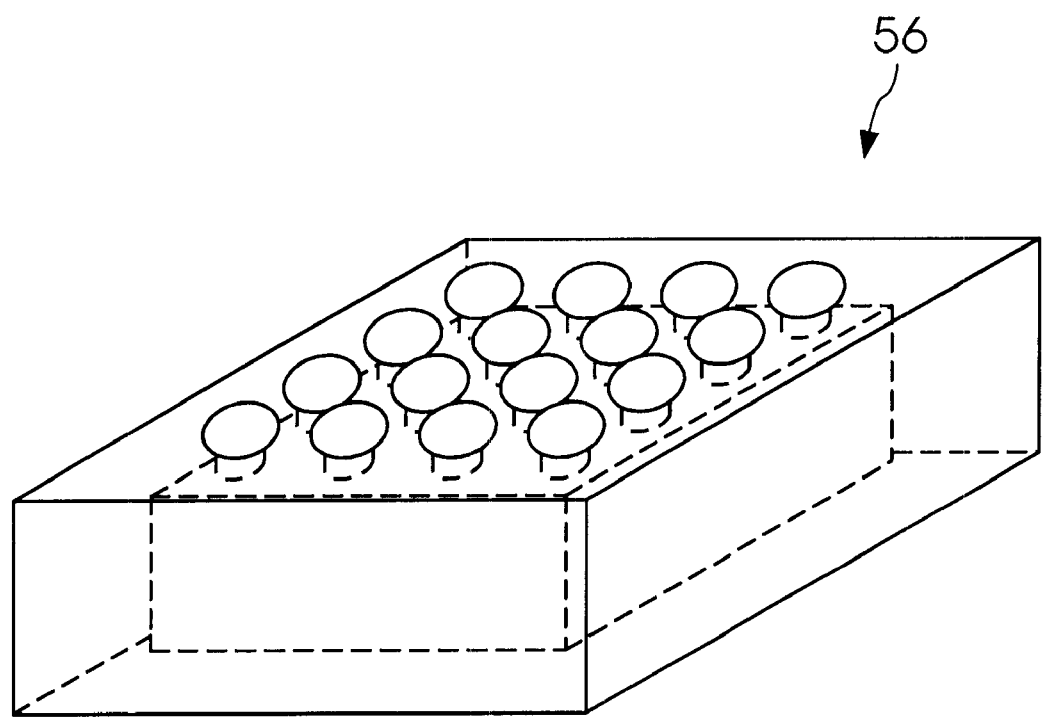
FIG. 21 is a perspective transparent drawing of the electronic component 56 in the second embodiment.

Moreover, cutting can use a standard dicing apparatus, but a laser cutting apparatus using a laser can also be used. Moreover, the thickness of the cutting blade of the dicing apparatus 46 is between 5–200 μm, and is thinner than the width of the grooves. FIG. 21 is a transparent perspective drawing of the electronic component 56.

Above, the fabrication method of the electronic component according to the second embodiment of the present invention was explained.

In process S12 and process S20, encapsulating resin 18 and encapsulating resin 40 were screen printed, but after these processes, a process that eliminates bubbles mixed into the screen printed encapsulating resin 18 and the encapsulating resin 40 should be provided.

According to the embodiments explained above, because an electronic component having a substrate that is completely surrounded by encapsulating resin 18 is fabricated by simple processes using inexpensive equipment, the production efficiency is extremely high. In addition, because the entire substrate is surrounded by the encapsulating resin 18, there is no influence from moisture, etc., and thus the reliability is extremely high. Furthermore, because the wafer 10 is ground, it is extremely thin, and an electronic component having a small package as a whole can be obtained. In addition, the fabricated electronic component has a rectangular shape, and because the six surfaces are flattened, marking is also simplified. Furthermore, because the electronic component fabricated by the present embodiment is solid, mounting on the motherboard by an automatic mounter is possible.

In addition, in process S11 using a dicing apparatus, only the dicing of wafer 10 is carried out, and in process S26, only the dicing of the encapsulating resins 18 and 40 is carried out. That is, because the dicing apparatus cuts only a simple material, there is little ware on the cutting blade and thus there is no problem with, for example, detachment produced when cutting a complex material (the wafer 10 and the encapsulating resins 18 and 40).

Third Embodiment

Figure 22:
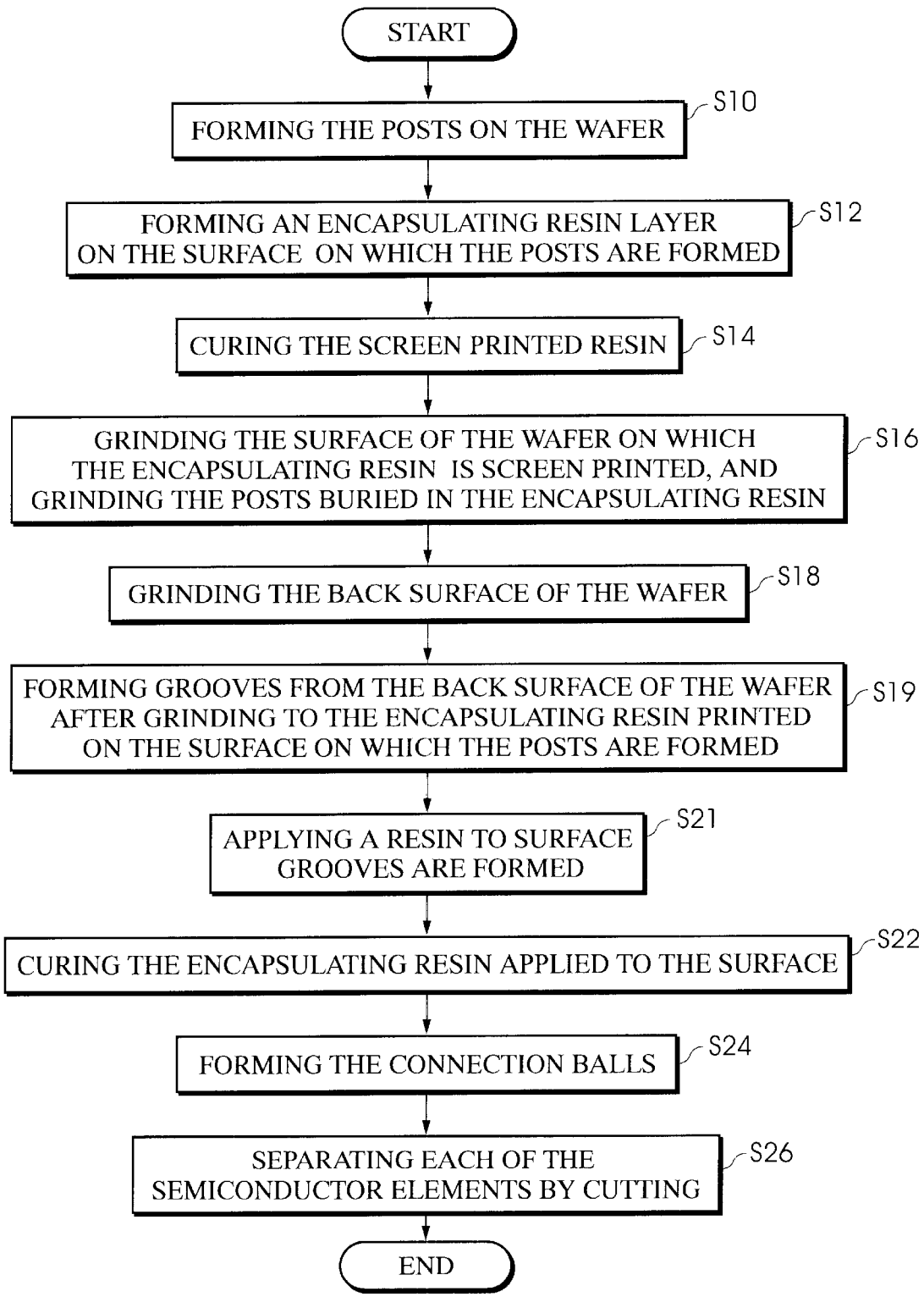
FIG. 22 is a drawing showing the order of the processes of the fabrication method of electronic circuits according to the third embodiment of the present invention.

Next, a third embodiment of the present invention will be explained. FIG. 22 is a drawing showing the order of processes for the fabrication method of an electronic component according to the third embodiment of the present invention. The difference between the fabrication method for an electronic component according to the third embodiment of the present invention shown in FIG. 22 and the fabrication method for an electronic component according to the second embodiment of the present invention shown in FIG. 11 is that in FIG. 22, the process S11 shown in FIG. 11 has been omitted, and a process S19 is provided as a process following process S18 in FIG. 11. Moreover, when comparing FIG. 22 and FIG. 11, in FIG. 22, the processing of process S21 is provided, while in FIG. 11, the processing of process S20 is provided. However, these processes are substantially identical processes.

Below, the third embodiment of the present invention will be explained in detail. Moreover, in the following explanation, the explanation of processes identical to those in FIG. 11 will be omitted. Fist, a process (process S10) is carried out in which posts 14 are formed on the wafer 10 (see FIG. 12) in which the electronic circuits will be formed using planar technology. The cross-section of the wafer 10 after the posts 14 are formed is identical to that shown in FIG. 12.

Figure 23:
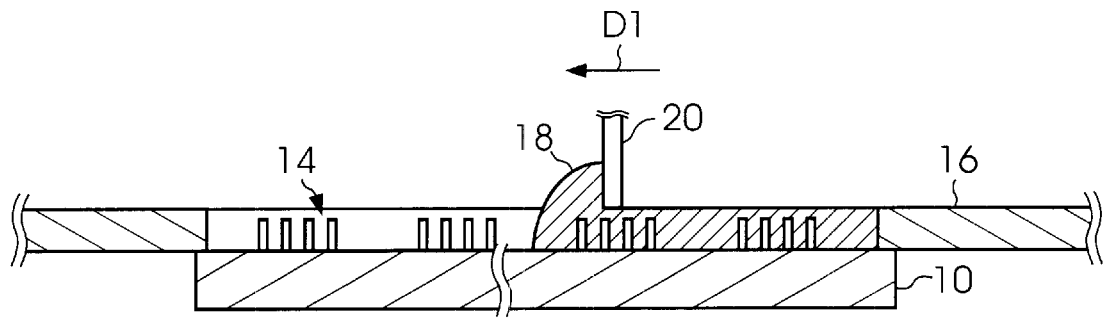
FIG. 23 is a drawing for explaining the process in which the encapsulating resin layer is formed on the surface on which the posts 14 are formed in the third embodiment of the present invention.

Next, a process (process S12) is carried out in which the surface on which the posts 14 have been formed is printed by using encapsulating resin. FIG. 23 is a drawing for explaining the process in which the encapsulating resin layer is formed on the surface on which posts 14 are formed. When FIG. 23 and FIG. 14 are compared, they differ on the point of whether or not grooves are formed in the wafer 10. In addition, the relationship between the thickness of the printing screen 16 that determines the position of the encapsulating resin 18 on the surface and the height of the posts 14 is the same as the relationship explained using FIGS. 15A to 15C.

Figure 24:
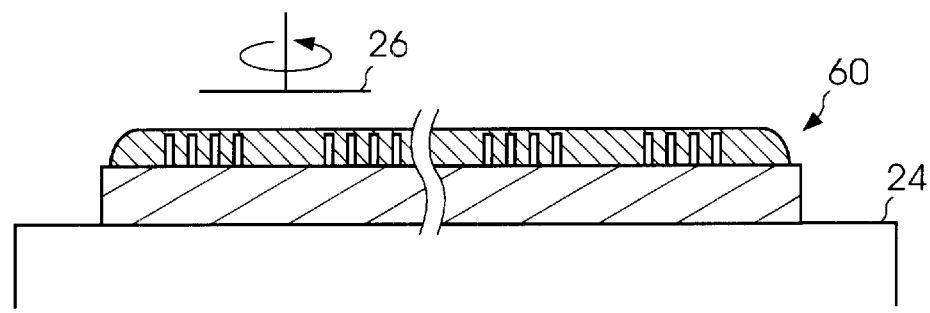
FIG. 24 is a drawing for explaining the process in which the posts 14 are ground in the third embodiment of the present invention.

Next, in process S12, a process (process S14) is carried out in which the printed resin is cured and then a process (process S16) is carried out in which the surface of the wafer 10 on which the encapsulating resin 18 is printed is ground and the posts 14 embedded in the encapsulating resin are ground. FIG. 24 is a drawing explaining the process in which the posts 14 are ground in the third embodiment of the present invention. Moreover, in order to simplify understanding, FIG. 24 is a cross-sectional drawing showing only the electronic component that has been fabricated by carrying out the processes up to process S14, and this is shown by reference numeral 60.

Figure 25:
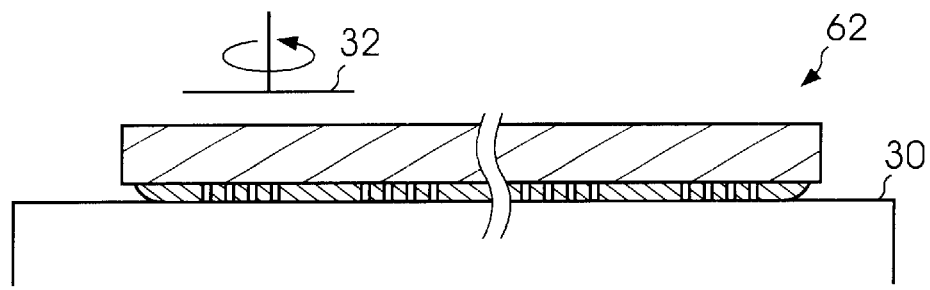
FIG. 25 is a drawing for explaining the process in which the back surface of the electronic component 60 is ground in the third embodiment of the present invention.

Next, when the grinding of the encapsulating resin 18 has finished, a process (process S18) is carried out in which the back surface of the electronic component 60, that is, the back surface of the wafer 10, is ground. FIG. 25 is a drawing for explaining the process in which the back surface of the electronic component 60 is ground in the third embodiment of the present invention. Moreover, in order to simplify understanding, FIG. 25 is a cross-sectional drawing showing only the electronic component fabricated by carrying out the processes up to process S16, and this is shown by reference numeral 62. In this process, after the surface of the electronic component 62 on which encapsulating resin has been printed is turned down and anchored by an anchoring fitting 30, the back surface of the electronic component 62, that is, the back surface of the wafer 10, is ground by the grinding apparatus 32 until the wafer 10 becomes about half the original thickness or an arbitrary thickness.

When the above processes have finished, a process (process S19) is carried out in which grooves are formed from the back surface of the wafer 10 after grinding to the encapsulating resin 18 printed on the surface on which the posts 14 are formed. When FIG. 22, which shows the fabrication method of an electronic component according to the third embodiment of the present invention is simply compared to FIG. 11, which shows the fabrication method of electronic components according to the second embodiment of the present invention, process S11 in FIG. 11 is moved to follow process S18, and is as shown in FIG. 22. In the fabrication process shown in FIG. 11, because grooves are formed during the beginning processes, parts of the wafer become thin, and there is a concern that the wafer 10 may break when the processes following the formation of the grooves are carried out. In the present embodiment, in order to resolve this problem, the process in which the grooves are formed in wafer 10 should be among the last processes.

Figure 26:
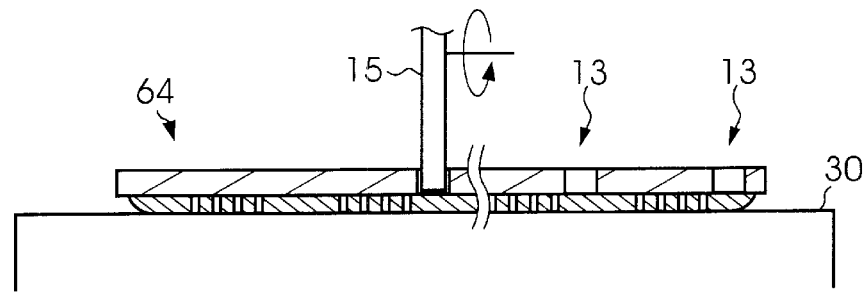
FIG. 26 is a cross-sectional drawing for explaining the feature in which the grooves are formed from the back surface side of the wafer 10 in the third embodiment of the present invention.

FIG. 26 is a cross-sectional drawing for explaining the feature in which grooves are formed from the back surface of the wafer 10 in the third embodiment of the present invention. To form grooves 13, 13, . . . , an apparatus identical to the dicing apparatus 15 shown in FIG. 13 is used. These grooves 13, 13, . . . , are formed up to the encapsulating resin applied in process S12. Here, the grooves are formed by the dicing apparatus 15 after the wafer 10 has been thinned, and thus there is little ware on the cutting blade of the dicing apparatus 15. In addition, the wafer 10 in which the grooves 13, 13, . . . , are formed has the encapsulating resin 18 applied in FIG. 26, and thus the strength as a whole increases in comparison to the wafer 10 shown in FIG. 13. Thus, wafer 10 is difficult to break, and is favorable for subsequent processes. Moreover, in order to simplify understanding, FIG. 26 is a cross-sections drawing showing only the electronic component fabricated by processes carried out up to process S19, and this is shown by reference numeral 64.

Figure 27:
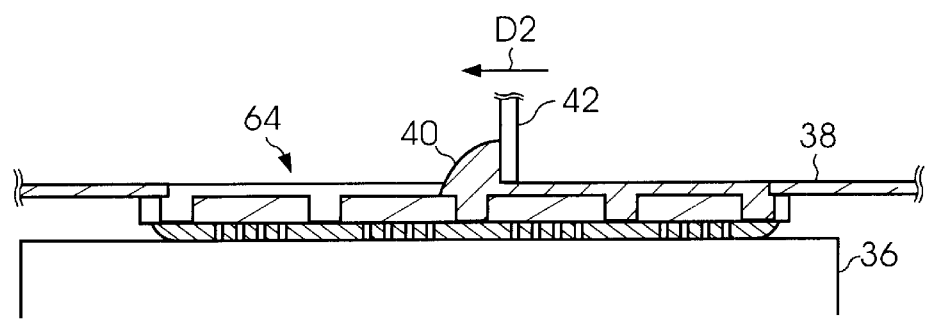
FIG. 27 is a drawing for explaining the process in which the resin is applied to the surface in which grooves are formed in process S19 in the third embodiment of the present invention.

In step S19, when the grooves 13, 13, . . . , are formed, next, a process (process S21) is carried out in which resin is applied to the surface in which grooves 13, 13, . . . , are formed. FIG. 27 is a drawing for explaining the process in which the resin is applied to the surface in which the grooves have been formed by process S19. In the case that resin is applied, like the case explained using FIG. 19, the electronic component 64 is anchored by suction by a suction anchoring plate 36, and printing of the encapsulating resin 40 is carried out using the printing screen 38 and the squeegee 42. Moreover, the application method for the encapsulating resin 40 to the back surface of the electronic component 64 is not limited to a printing screen, but can be carried out by other processes, such as spray coating, spin coating, or metallic molding.

Next, a process (process S22) is carried out in which the encapsulating resin 40 applied in process S21 is cured by drying using, for example, a hot air dryer (not illustrated). Moreover, while during printing in the above-described process S21, the encapsulating resin 18 is preferably printed using pressure differences, in order to increase the penetration of the encapsulating resin 18 into the grooves 13, 13, . . . , in the processes carried out after printing, the encapsulating resin 18 is cured by applying a pressure greater than atmospheric pressure, which is termed pressure curing. In the case that the encapsulated resin 18 is cured, the curing is started by setting the temperature of the hot air dryer between 100 and 150° C. and setting the drying time between 1 and 3 hours. When the drying is started, the pressure curing is carried out at least until the encapsulating resin 18 has gelled by setting the added pressure between $5 \times 10^5$ to $2 \times 10^6$.

By carrying out the above processes, the strength of the wafer 10 is increased because the encapsulating resin 18 and the encapsulating resin 40 that are cured on the front surface and the back surface of the electronic component are formed. Next, a process (process S24) is carried out in which connection balls are formed for electrically connecting the electronic circuits formed in the semiconductor element 12 and the electronic circuits formed in the external motherboard (not illustrated). This process is identical to that of the second embodiment of the present invention.

Figure 28:
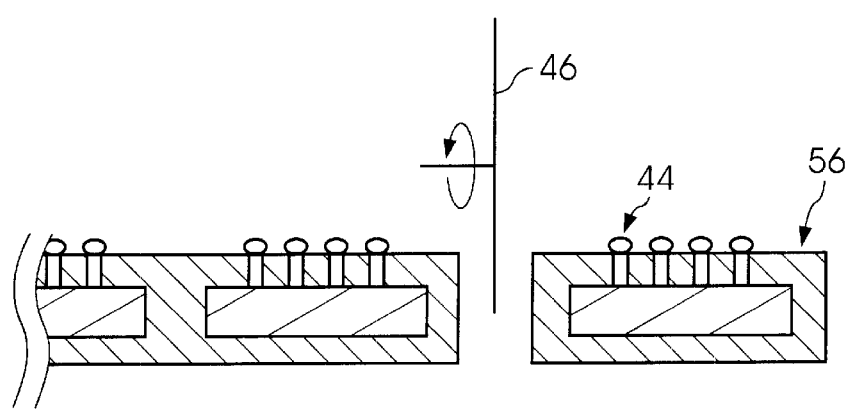
FIG. 28 is a drawing explaining the process in which the electronic component 56 is formed by separating semiconductor elements 12 into individual units.

Finally, a process (process S26) is carried out in which the semiconductor elements 12 are separated into individual parts by cutting the electronic component. FIG. 28 is a drawing for explaining the process in which the electronic components 56 are formed by separating the semiconductor elements 12 into individual parts. In this process, the semiconductor elements 12 are separated into individual parts by cutting by using an apparatus identical to the dicing apparatus 46 shown in FIG. 20. As can be understood from FIG. 28, the electronic component 56 finally formed is an electronic component identical to the electronic components shown in FIG. 20 and FIG. 21.

According to the third embodiment of the present invention explained above, since an operational effect is obtained that is identical to that of the above-described second embodiment of the present invention, encapsulating resin is applied to the surface on which the posts 14 are formed, and the grooves are formed after the back surface of wafer 10 is ground, and thus the strength of the wafer 10 as a whole is increased, and in the subsequent processes, breaking of the wafer 10 can be prevented.

What is claimed is:

1. A fabrication method for electronic components characterized in comprising:

a first application process in which an encapsulating resin is applied to the surface of a substrate on which a circuit and posts are formed;

a back surface grinding process, being carried out after said first application process, in which the back surface of said substrate is ground;

a second application process, being carried out after said back surface grinding process, in which a resin having a contraction stress which is just sufficient to correct warping arising from said back surface grinding process after curing is applied to the back surface of said substrate after grinding; and a separation process, being carried out after said second application process, in which said substrate is cut along with said encapsulating resin and the individual electronic components are separated.

2. A fabrication method for electronic components characterized in comprising:

a groove formation process in which grooves are formed in the surface of a substrate on which posts are formed;

a first application process, being carried out after said groove formation process, in which an encapsulating resin is applied to the surface in which said grooves are formed;

a back surface grinding process, being carried out after said first application process, in which the back surface of said substrate is ground until said grooves are exposed;

a second application process, being carried out after said back surface grinding process, in which a resin having a contraction stress which is just sufficient to correct warping arising from said back surface grinding process after curing is applied to the back surface of said substrate after grinding; and a separation process, being carried out after said second application process, in which said encapsulating resin filling the groove part is cut and the individual electronic components are separated.

3. A fabrication method for electronic components according to claim 1 or claim 2 characterized in further having a curing process that cures the encapsulating resin applied in said first application process.

4. A fabrication method for electronic components according to claim 1 or claim 2 characterized in further having a surface grinding process in which the surface on which said encapsulating resin was applied before said back surface grinding process is ground.

5. A fabrication method for electronic components according to claim 1 or claim 2 characterized in further having a hardening process in which the encapsulating resin applied in said second application process is hardened.

6. A fabrication method for electronic components according to claim 1 or claim 2 characterized in further having a connection ball formation process in which connection balls are formed on said posts before said separation process.

7. A fabrication method for electronic components according to claim 6 wherein said connection ball formation process is characterized in comprising:

a process of screen printing solder paste on said posts; and a process of quenching the screen printed solder paste after melting.

8. A fabrication method for electronic components according to claim 1 or claim 2 characterized in said first application process applying said encapsulating resin by screen printing.

9. A fabrication method for electronic components according to claim 1 or claim 2 characterized in said second application process applying said encapsulating resin by screen printing.

10. A fabrication method for electronic components according to claim 9 characterized in the thickness of the printing screen for screen printing used in said second application process being set according to the curing contraction percentage of the encapsulating resin used in said first application process.

11. A fabrication method for electronic components characterized in comprising:

a first application process in which a first encapsulating resin is applied to a front surface of a substrate on which posts are formed;

a back surface grinding process, being carried out after said first application process, in which a back surface of said substrate is ground until said substrate becomes a specified thickness;

a groove formation process, being carried out after said back surface grinding process, in which grooves which reach the first encapsulating resin applied in said first application process are formed in the back surface of said substrate;

a second application process, being carried out after said groove formation process, in which a second encapsulating resin is applied to the back surface in which said grooves are formed; and a separation process, being carried out after said second application process, in which the first and second encapsulating resin that fills the groove part is cut and the individual electronic components are separated.

12. A fabrication method for an electronic component according to claim 11 characterized in further comprising a curing process in which the encapsulating resin applied by said second application process is pressure cured.

13. A fabrication method for electronic components according to claim 11 or claim 12 characterized in further comprising a front surface grinding process in which the front surface to which said encapsulating resin that is applied before said back surface grinding process is ground.

14. A fabrication method for an electronic component according to claim 13 characterized in further comprising a connection ball formation process in which connection balls for said posts are formed before said separation process.

* * * * *